US011127839B2

United States Patent
Jelinek et al.

(10) Patent No.: US 11,127,839 B2
(45) Date of Patent: Sep. 21, 2021

(54) METHOD OF MANUFACTURING A TRENCH OXIDE IN A TRENCH FOR A GATE STRUCTURE IN A SEMICONDUCTOR SUBSTRATE

(71) Applicant: Infineon Technologies AG, Neubiberg (DE)

(72) Inventors: Moriz Jelinek, Villach (AT); Kang Nan Khor, Nibong Tebal (MY); Armin Schieber, Villach (AT); Michael Stadtmueller, Villach (AT); Wei-Lin Sun, Villach (AT)

(73) Assignee: Infineon Technologies AG, Neubiberg (DE)

( * ) Notice: Subject to any disclaimer, the term of this patent is extended or adjusted under 35 U.S.C. 154(b) by 16 days.

(21) Appl. No.: 16/723,147

(22) Filed: Dec. 20, 2019

(65) Prior Publication Data

US 2020/0212203 A1   Jul. 2, 2020

(30) Foreign Application Priority Data

Dec. 28, 2018 (EP) .................................... 18001016

(51) Int. Cl.
| | |
|---|---|
| *H01L 29/66* | (2006.01) |
| *H01L 21/02* | (2006.01) |
| *H01L 21/311* | (2006.01) |
| *H01L 21/3115* | (2006.01) |
| *H01L 29/423* | (2006.01) |

(52) U.S. Cl.
CPC .... *H01L 29/66666* (2013.01); *H01L 21/0234* (2013.01); *H01L 21/02164* (2013.01); *H01L 21/31144* (2013.01); *H01L 21/31155* (2013.01); *H01L 29/4236* (2013.01)

(58) Field of Classification Search
None
See application file for complete search history.

(56) References Cited

U.S. PATENT DOCUMENTS

| | | |
|---|---|---|
| 6,326,281 B1 | 12/2001 | Violette et al. |
| 6,551,881 B1 | 4/2003 | Letavic |
| (Continued) | | |

FOREIGN PATENT DOCUMENTS

| | | |
|---|---|---|
| DE | 10219123 A1 | 11/2003 |

OTHER PUBLICATIONS

Saxena, Raghvendra Sahai, et al., "Polysilicon Spacer Gate Technique to Reduce Gate Charge of a Trench Power MOSFET", IEEE Transactions on Electron Devices, vol. 59, No. 3, Mar. 2012, pp. 738-744.

*Primary Examiner* — Asok K Sarkar
(74) *Attorney, Agent, or Firm* — Murphy, Bilak & Homiller, PLLC

(57) ABSTRACT

A method of manufacturing a trench oxide in a trench for a gate structure in a semiconductor substrate is described. The method includes: generating the trench in the semiconductor substrate; generating an oxide layer over opposing sidewalls of the trench; damaging at least a portion of the oxide layer by ion implantation; coating the oxide layer with an etching mask; generating at least one opening in the etching mask adjacent to one of the opposing sidewalls; and partly removing the oxide layer by etching the oxide layer beneath the etching mask down to an etching depth at the one of the opposing sidewalls by introducing an etching agent into the opening.

11 Claims, 6 Drawing Sheets

(56) References Cited

U.S. PATENT DOCUMENTS

| | | |
|---|---|---|
| 6,750,116 B1 | 6/2004 | Chen |
| 2006/0166419 A1* | 7/2006 | Shimoyama ...... H01L 29/66621 438/173 |
| 2009/0072306 A1 | 3/2009 | Izumi |
| 2009/0114968 A1 | 5/2009 | Wang et al. |
| 2011/0049618 A1 | 3/2011 | Lee et al. |
| 2013/0341708 A1 | 12/2013 | Sumida |
| 2018/0061644 A1 | 3/2018 | Laven et al. |

* cited by examiner

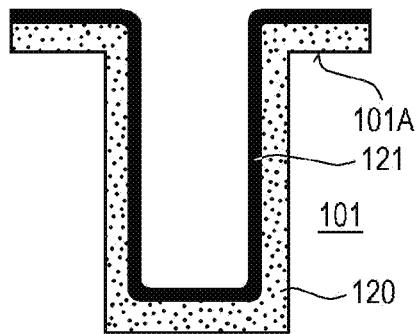
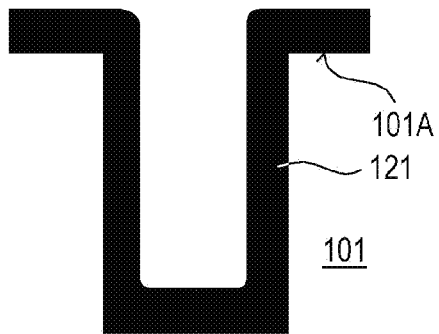
Fig. 3A          Fig. 3B
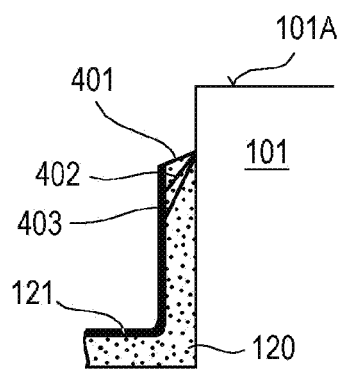
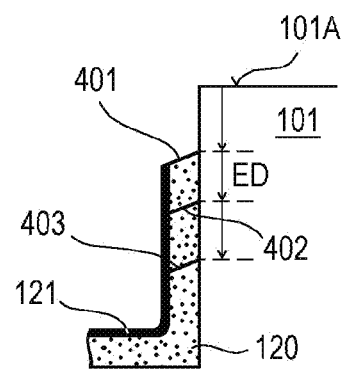
Fig. 4A          Fig. 4B

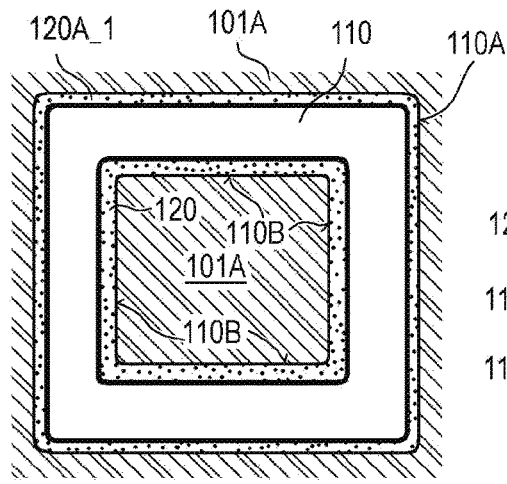 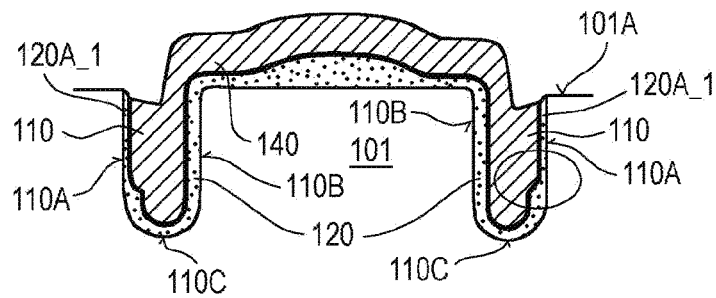
Fig. 10A  Fig. 10B
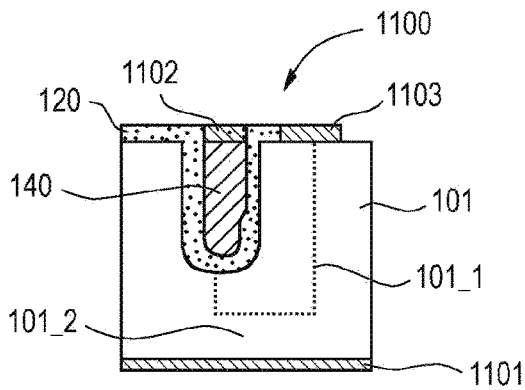
Fig. 11
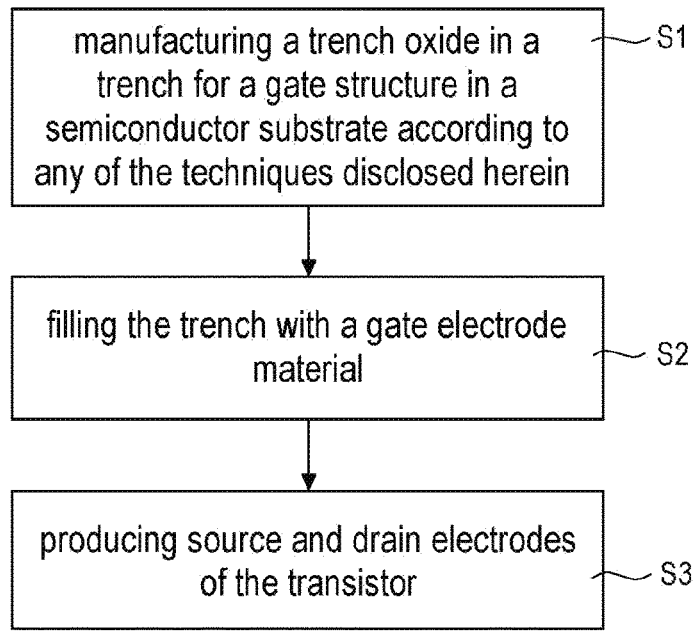
Fig. 12

METHOD OF MANUFACTURING A TRENCH OXIDE IN A TRENCH FOR A GATE STRUCTURE IN A SEMICONDUCTOR SUBSTRATE

TECHNICAL FIELD

This disclosure relates to the field of semiconductor device manufacturing, and in particular to the technique of manufacturing an oxide layer over sidewalls of a trench for a gate structure in a semiconductor substrate.

BACKGROUND

The ongoing trend to higher integration densities and improved device characteristics has boosted the usage of trench structures in semiconductor substrates. In many cases, the sidewalls of the trench structures need to be cladded by an oxide layer of highly controllable dimensional and structural parameters. Especially, parameters such as layer thickness, shape, uniformity and integrity need to be within small tolerance margins to guarantee compliance with device specifications and to keep the scrap rate low.

SUMMARY

A method of manufacturing a trench oxide in a trench for a gate structure in a semiconductor substrate is described. The method comprises generating the trench in the semiconductor substrate. An oxide layer is generated over opposing sidewalls of the trench. At least a portion of the oxide layer is damaged by ion implantation. The oxide layer is coated with an etching mask. At least one opening is formed in the etching mask adjacent to one of the opposing sidewalls. The oxide layer is partly removed by etching the oxide layer beneath the etching mask down to an etching depth at the one of the opposing sidewalls by introducing an etching agent into the opening.

A method of manufacturing a transistor comprises manufacturing a trench oxide in a trench for a gate structure in a semiconductor substrate, e.g., as described above. The trench is filled with a gate electrode material. Source and drain electrodes of the transistor are produced.

A semiconductor substrate comprises a trench for a gate structure formed in the semiconductor substrate. An oxide layer is formed over opposing sidewalls of the trench. The oxide layer comprises a first portion formed over a first sidewall and a second portion formed over a second sidewall opposite the first sidewall. The first portion comprises a first section having a first thickness, a second section beneath the first section having a second thickness and a transitional section connecting the first and second sections. The second thickness is greater than the first thickness and a thickness of the second portion is substantially equal to the second thickness.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3A-3B are schematic cross-sectional views illustrating exemplary options of damaging a trench oxide along both sidewalls of the trench.

FIGS. 4A-4B are schematic cross-sectional views illustrating exemplary vertical positions and inclination angles of a trench oxide for different implantation doses and different etching times, respectively.

FIG. 10A is a top view of an exemplary circumferential trench.

FIG. 10B is a cross-sectional view of an exemplary circumferential trench.

FIG. 11 is schematic cross-sectional view illustrating an example of a trench transistor.

FIG. 12 is a flowchart illustrating an exemplary method of manufacturing a transistor.

DETAILED DESCRIPTION

It is to be understood that the features of the various exemplary embodiments and examples described herein may be combined with each other, unless specifically noted otherwise.

As used in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

Figure 1A:
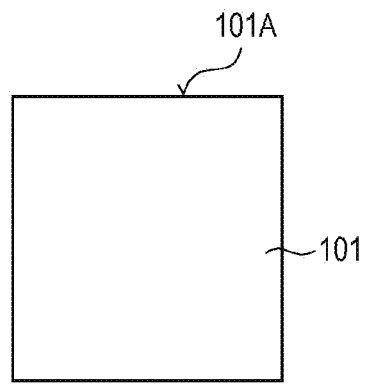
FIGS. 1A-1J are schematic cross-sectional views illustrating exemplary stages of manufacturing a trench oxide in a semiconductor substrate.

FIGS. 1A-1J illustrate schematic representations of stages of an exemplary method of manufacturing a trench oxide in a trench for a gate structure in a semiconductor substrate. A semiconductor substrate 101 is shown in FIG. 1A. The semiconductor substrate 101 may be or comprise of semiconductor material(s) such as, e.g., Si, SiC, SiGe, etc., and may, e.g., contain inorganic and/or organic materials that are not semiconductors.

Figure 1B:
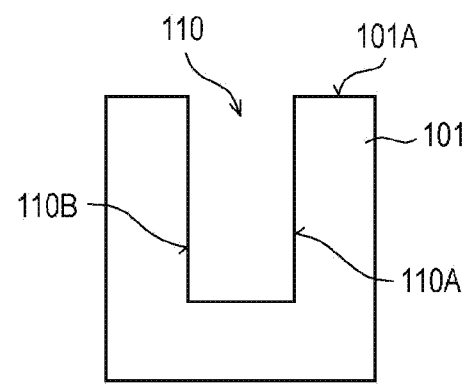

Referring to FIG. 1B, a trench 110 is formed in the semiconductor substrate 101. Trench formation may, e.g., be performed by applying an etching mask (not shown) to a horizontal top surface 101A of the semiconductor substrate 101, by shaping the etching mask by a photoresist (not shown) to expose a trench region at the top surface 101A and by etching the trench 110 through the shaped etching mask.

Figure 1C:
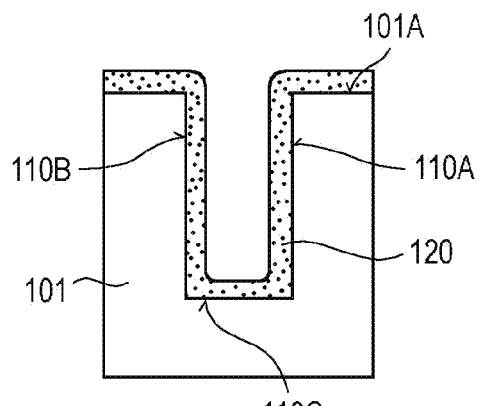

Referring to FIG. 1C, an oxide layer 120 is generated over opposing sidewalls (first sidewall 110A and second sidewall 110B) of the trench 110. Further, the oxide layer 120 may extend over at least a part of the top surface 101A of the semiconductor substrate 101 and may extend over a bottom surface 110C of the trench 110. The oxide layer 120 may be continuous and may, e.g., completely cover all substrate surfaces (sidewalls 110A, 110B, bottom surface 110C) of the trench 110. The oxide layer 120 may have a thickness of equal to or greater than 150 nm, 175 nm or 200 nm.

The oxide layer 120 may be a mono-material layer (i.e. a layer of a single homogeneous material) of a thermal oxide, e.g. a silicon oxide layer which is formed by thermally oxidizing silicon. A mono-material layer of thermal oxide ensures that boundary effects are avoided, i.e. that a uniform etch rate across the layer thickness (as long as the oxide layer 120 is undamaged) is provided. Other possibilities such as a mono-material TEOS (tetraethyl orthosilicate) layer or a dual-material layer composed of, e.g., a thermal oxide layer and a TEOS layer could, e.g., also be used.

Figure 1D:
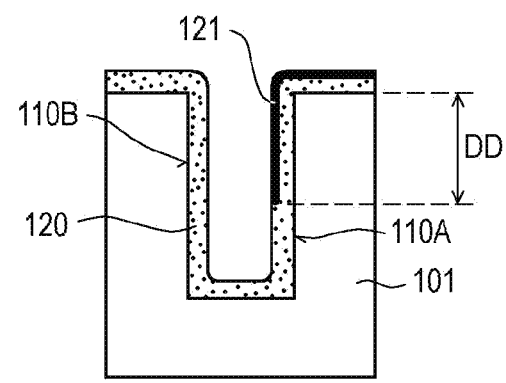

Referring to FIG. 1D, at least a portion 121 of the oxide layer 120 is damaged by ion implantation. In FIG. 1D the damaged portion 121 is depicted to be arranged only over the first sidewall 110A of the trench 110, but generally, a damaged portion (not shown in FIG. 1D) similar to the damaged portion 121 can also be arranged over the second sidewall 110B opposite the first sidewall 110A. In the example of FIG. 1D, the damaged portion 121 is, e.g., not arranged over the bottom surface 110C of the trench 110.

Further, in the example of FIG. 1D, the damaged portion 121 (and, e.g., a damaged portion arranged along the second sidewall 110B opposite the damaged portion 121) extends along the first sidewall 110A (respectively along the second sidewall 110B) of the trench 110 down to a damaging depth DD (as measured from the top surface 101A), while a residual depth of the oxide layer 120 down to the bottom surface 110C of the trench 110 is kept undamaged.

As shown in FIG. 1D, only a region close to the surface of the oxide layer 120 may be damaged, while deeper regions of the oxide layer 120 beneath the damaged portion 121 (in lateral direction) may remain substantially undamaged.

Figure 1E:
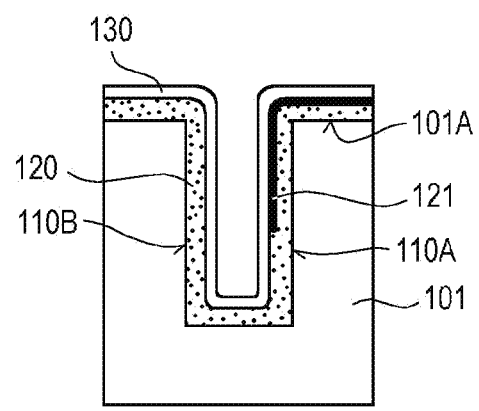

Referring to FIG. 1E, the oxide layer 120 is coated with an etching mask 130. The etching mask 130 may, e.g., be a nitride film. The etching mask 130 may completely cover the oxide layer 120.

Figure 1F:
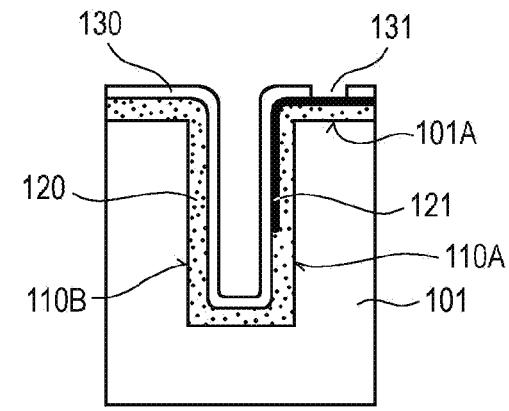

Referring to FIG. 1F, an opening 131 may be generated in the etching mask 130. The opening 131 may be generated in a horizontal portion of the etching mask 130 outside the trench 110. The opening 131 may be located near an edge of the trench 110. In particular, the opening 131 (or openings) may be arranged adjacent to only one sidewall (here the first sidewall 110A) of the trench 110, while the etching mask 130 remains unopened in the vicinity of the other sidewall (here second sidewall 110B).

Figure 1G:
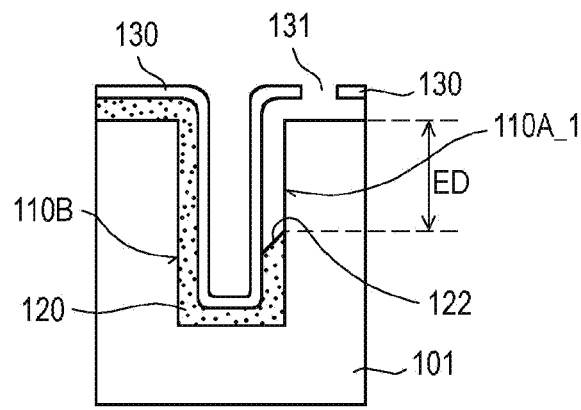

Referring to FIG. 1G, the oxide layer 120 beneath the etching mask 130 is etched down to a predetermined etching depth ED (as measured from the top surface 101A) at the first sidewall 110A. That way, an exposed surface portion 110A_1 of the first sidewall 110A of the trench 110 of length ED is generated. As will be explained further below in more detail, by virtue of the damaging procedure, a surface 122 of a residual portion of the oxide layer 120 may be tilted with respect to a transverse plane of the trench 110. More specifically, the surface 122 of the residual portion of the oxide layer 120 may have a monotonically increasing surface progression in lateral outward trench direction.

The damaging depth DD may be less than or greater than or approximately equal to the etching depth ED, i.e. DD<ED, DD>ED or DD=ED, respectively. In the latter case (DD=ED), the lower end of the damaged portion 121 may serve as an etch stop or etch deceleration means. The approach to control the tilt angle of the surface 122 by ion implantation parameters (e.g. by the implantation dose) and the etching depth ED by etching parameters (e.g. by the etching time) will be discussed further below in greater detail.

Figure 1H:
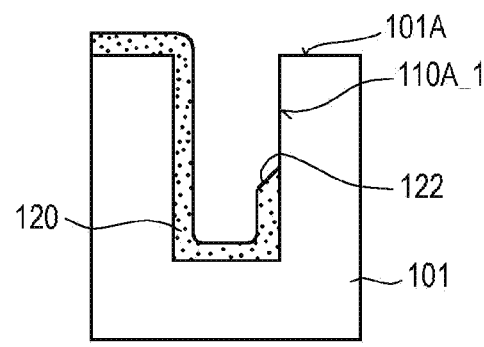

Referring to FIG. 1H, the etching mask 130 may then be removed. Removal of the etching mask 130 may be done by any appropriate technique available in the art. As a result, a trench oxide as formed by the residual portion of the partly removed oxide layer 120 is provided.

Figure 1I:
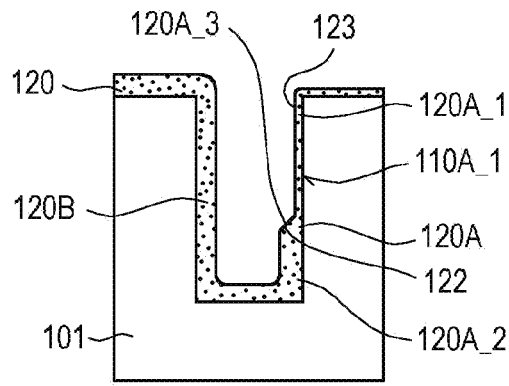

Referring to FIG. 1I, a thin oxide layer 123 may then be generated (grown) over the exposed surface portion 110A_1 of the first sidewall 110A of the trench 110. There are various different processes available for generating the thin oxide layer 123. The generation of the thin oxide layer 123 results in a semiconductor substrate 101 including a trench 110 formed in the semiconductor substrate 101, and including an oxide layer 120 formed over the first and second sidewalls 110A, 110B of the trench 110, wherein the oxide layer 120 comprises a first portion 120A formed over the first sidewall 110A of the trench 110 and a second portion 120B formed over the second sidewall 110B of the trench 110. Further, the first portion 120A of the oxide layer 120 includes a first section 120A_1 (e.g. the thin oxide layer 123 as referred to above) having a first thickness, a second section 120A_2 beneath the first section 120A_1 having a second thickness and a transitional section 120A_3 (e.g. partially limited by the surface 122) connecting the first section 120A_1 and the second section 120A_2.

The second thickness (of the second section 120A_2) is greater than the first thickness (of the first section 120A_1). Further, a thickness of the second portion 120B may, e.g., be substantially equal to the second thickness (of the second section 120A_2).

Figure 1J:
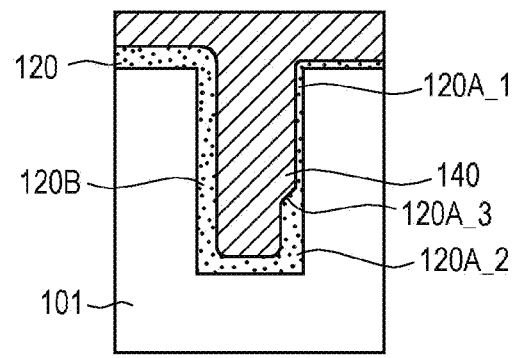

Referring to FIG. 1J, the trench 110 may then be filled with a gate electrode material 140. The gate electrode material 140 may, e.g., comprise or be of polysilicon or any other electrically conducting material.

The structure shown in FIG. 1J may be used for manufacturing a transistor gate. More specifically, vertical transistor gates such as, e.g., transistor gates of IGBTs (insulated gate bipolar transistors) or other MOSFETs (metal oxide semiconductor field effect transistors) for switching high voltages may utilize one or more of the techniques described herein. In such transistor gate applications the first section 120A_1 of the oxide layer 120 (which corresponds to the thin oxide layer 123) may form the channel gate oxide and needs to be comparatively thin (first thickness may be equal to or less than 150 nm, 125 nm or 100 nm) in order to provide for suitable threshold voltages of the transistor. On the other hand, the oxide layer 120 (i.e. trench oxide) along the residual parts of the first and second sidewalls 110A, 110B as well as along the bottom surface 110C of the trench 110 needs to be significantly thicker than the channel gate oxide to avoid degradation of the oxide layer 120 and to ensure mechanical strength and sufficient resistance against mechanical tension during filling the trench 110 with the gate electrode material 140.

Therefore, the transitional section 120A_3 connecting the first section 120A_1 with the second section 120A 2 is a performance-critical structural element of the oxide layer 120. The more controllable the transitional section 120A_3 can be shaped in terms of position (i.e. depth in the trench 110), inclination angle and contour smoothness, the more reliable and better are the device characteristics and the easier it is to guarantee compliance with manufacturing tolerances and to keep the scrap rate low.

According to one aspect, the implantation energy may be used to control the damage profile of the oxide layer 120 in lateral direction, i.e. the lateral thickness of the damaged portion 121 of the oxide layer 120.

According to one aspect, the implantation dose may be used to control the degree of damage of the oxide layer 120 (for a given implantation ion species). As the lateral and vertical etch rate depends on the degree of damage of the oxide layer 120, the etching will proceed more rapidly in the damaged portion 121 of the oxide layer 120 than in the laterally deeper undamaged region. Therefore, the etching front proceeds with a constant inclination angle (depending only on the implantation dose for a given implantation energy) down the sidewall of the trench 110. Hence, the implantation dose (which controls the degree of damage) may be used to precisely control the inclination angle of the surface 122 of the residual portion of the oxide layer 120 during the etching process. The higher the implantation dose, the more acute is the inclination angle of the surface 122 created (for a given implantation energy).

The lateral and vertical etch rate also depends on the ion species which is used for implantation. Therefore, different inclination angles could also be obtained by using different implantation ion species for a given implantation dose.

It is to be noted that the inclination angle of the surface 122 is identical with the inclination angle of the transitional section 120A_3 of the oxide layer 120. Therefore, without loss of generality, the inclination angle is related to the transitional section 120A_3 of the oxide layer 120 in the following.

The vertical position of the transitional section 120A_3 of the oxide layer 120 adjacent to the sidewall 110A, i.e. the etching depth ED, is controlled by the etching time. The longer the etching process is continued, the greater is the etching depth ED. The etching depth ED does not depend on the implantation dose for a damage profile where damaging is produced only in a region close to the surface of the oxide layer 120.

Therefore, a combination of controlling the damage implantation dose, the etching time and, optionally, the implantation energy allows to obtain user-definable and arbitrary combinations of inclination angle and etching depth (i.e. depth of the transitional section 120A_3) of the oxide layer 120. More specifically, for a given implantation energy (damage profile), the inclination angle may be controlled by the implantation dose and does not depend from the etching time and the etching depth ED may be controlled by the etching time and does not dependent from the implantation dose. This independency allows a highly reproducible shaping of the transitional section 120A_3.

Figure 2A:
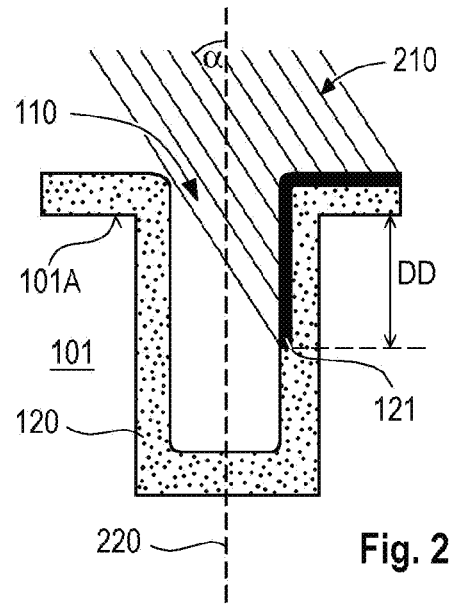
FIGS. 2A-2B are schematic cross-sectional views illustrating exemplary options of damaging a trench oxide down to a specific damaging depth.

Referring to FIG. 2A, damaging may comprise ion implantation using an ion beam 210 having a beam axis tilted against a vertical axis 220 of the trench 110. As shown in FIG. 2A, the damaging depth DD can be controlled by a variation of the tilt angle α.

Any ion species that causes implanted damage in the oxide layer 120 may be used. In particular, the ion beam 210 may comprise argon or any other non-dopant ion species. However, it is also possible that the ion beam comprises dopant species.

Implantation doses may range, e.g., from about $2\times10^{15}$ $cm^{-2}$ to about $4\times10^{16}$ $cm^{-2}$ according to the requested inclination angle of the transitional section 120A_3. However, doses outside this range may also be used. Tilt angles α may, e.g., be in a range of 25° to 30°. However, tilt angles α outside this range may also be used.

Figure 2B:
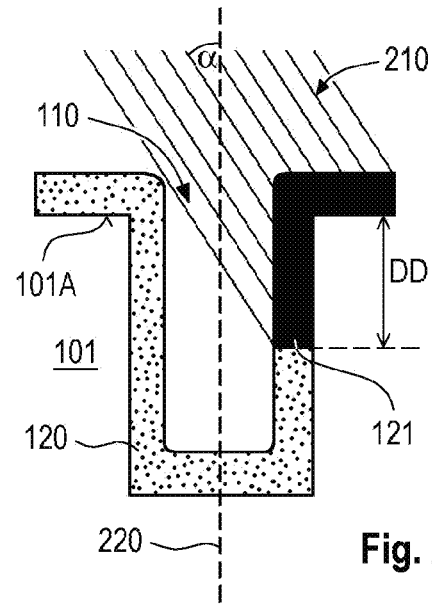

FIG. 2B illustrates tilted ion beam damaging similar to FIG. 2A, and reference is made to the above description in order to avoid reiteration. However, in contrast to the damaging process of FIG. 2A, another damaging profile is obtained by using higher implantation energy. In FIG. 2B the oxide layer 120 may be damaged throughout its entire lateral dimension along the damaged portion 121 of the oxide layer 120.

FIG. 3A illustrates an exemplary option of damaging the oxide layer 120 along both sidewalls 110A, 110B of the trench 110 and, optionally, along its entire extension (i.e. also along the bottom surface 110C of the trench 110). This type of damaging may be obtained by using plasma immersion ion implantation. Plasma immersion ion implantation is a cost efficient process which, however, does not allow to selectively damage only one of the two sidewalls 110A, 110B of the trench 110.

As already mentioned above, although not specifically depicted in the Figures, according to various embodiments the oxide layer 120 is damaged along both sidewalls 110A, 110B (as shown in FIG. 3A or 3B) but only down to a damaging depth DD (as shown in FIG. 2A or 2B) rather than along its entire extension. Such damaging profile may, e.g., be produced by 180° rotation of the substrate 101 during tilted ion beam 210 implantation (see FIGS. 2A, 2B) or by masking a lower part of the trench 110 followed by plasma immersion ion implantation and mask removal.

Similar to FIG. 2A, FIG. 3A illustrates an example in which damaging of the oxide layer 120 is only produced in a region close to the surface of the oxide layer 120, while FIG. 3B illustrates an example where the damage portion 121 of the oxide layer 120 may completely penetrate the oxide layer 120 similar to FIG. 2B.

FIG. 4A illustrates inclination angles of the transitional section 120A_3 for damaging profiles obtained from different implantation doses at the same etching time. The greater the implantation dose, the more acute is the inclination angle of the transitional section 120A_3 at 401, 402 and 403, respectively.

FIG. 4B illustrates the position and inclination angle of the transitional section 120A_3 depending on the etching time for a given implantation dose. The longer the etching time for the transitional section 120A_3 at 401, 402 and 403, respectively, the greater is the etching depth ED. The inclination angle does not depend on the etching time, i.e. irrespective of ED, the inclination angle at 401, 402 and 403 is always the same. FIG. 4B illustrates the inclination angle for the case of ED<=DD. However, the independency of the inclination angle from the etching time may remain valid for some range at ED>DD (at least as long as ED>>DD is not reached).

Figure 5:
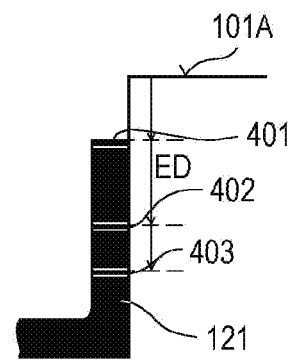
FIG. 5 is a schematic cross-sectional view illustrating exemplary vertical positions and inclination angles of a trench oxide for a damaging profile as shown in FIG. 2B.

Referring to FIG. 5, the inclination angle of the transitional section 120A_3 also does not depend on the etching depth ED if the damaging profile of FIG. 3B is used.

Figure 6:
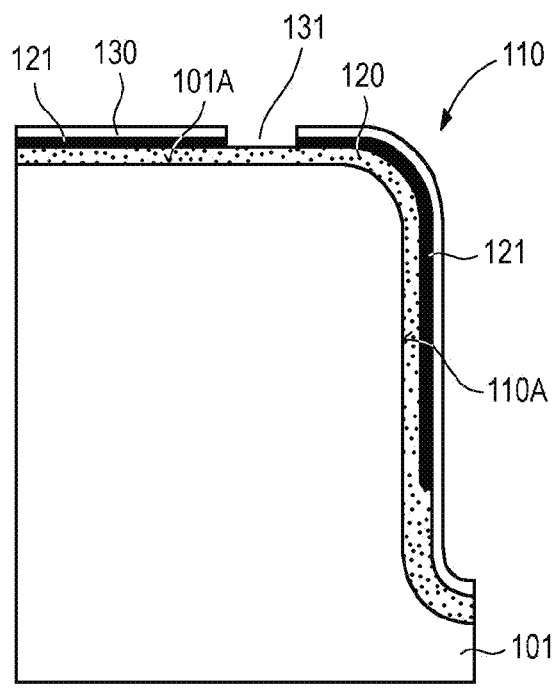
FIG. 6 is a schematic cross-sectional view of an edge and sidewall region of a trench before etching.

Referring to FIG. 6, an edge and sidewall region of the trench 110 before etching is shown. The opening 131 in the etching mask 130 is arranged in the horizontal part of the etching mask 130 close to the edge of the trench 110.

Figure 7:
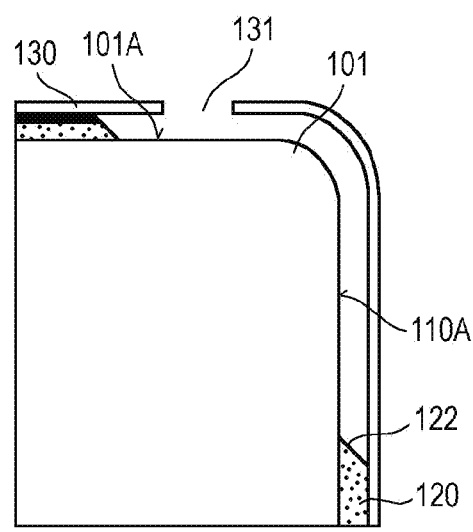
FIG. 7 is a schematic cross-sectional view of the edge and sidewall region of FIG. 6 after etching.

FIG. 7 illustrates the surface and sidewall region of the semiconductor substrate 101 after etching. As apparent in FIG. 7, the etching process between the substrate 101 and the etching mask 130 proceeds both in the vertical direction down the first sidewall 110A as well as in the horizontal direction along the top surface 101A of the semiconductor substrate 101.

Figure 8:
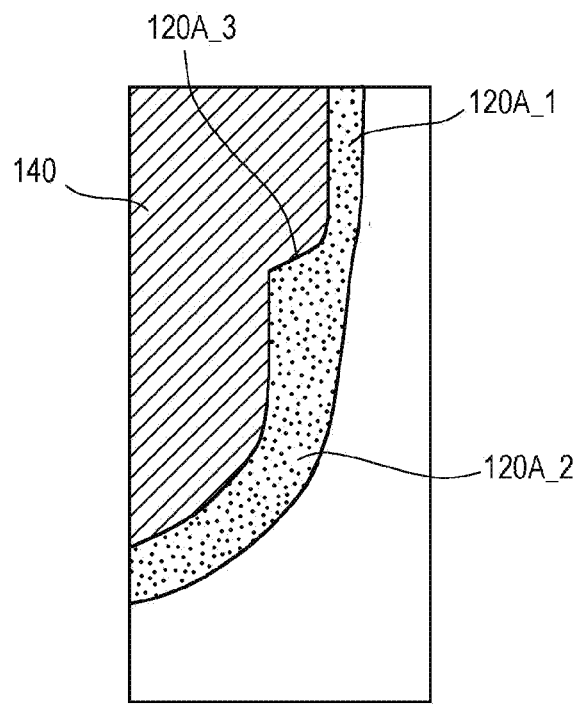
FIG. 8 is a contour-traced electron microscope image of a trench oxide flank formed at the trench sidewall at the etching depth.

FIG. 8 is a traced microscope image illustrating a contour of the transitional section 120A_3 connecting the first section 120A_1 and the second section 120A_2 of the oxide layer 120. The oxide layer 120 (trench oxide) shown in FIG. 8 may have been produced by a method as displayed in FIGS. 1A-D, 2A, 4A, 6 and 7. Apparently the transitional section 120A_3 has an increasing surface progression in lateral trench direction (i.e. from left to right). FIG. 8 is drawn to scale.

In FIG. 8, the surface progression of the transitional section 120A_3 is monotonically increasing. Further, the transitional section 120A_3 has a smooth contour which is free of any steps or kinks. This significantly facilitates the filling of the trench 110 by the gate electrode material 140. In particular, the smooth contour of the transitional section 120A_3 prevents that bubbles are captured during the filling process at the transitional section 120A_3. Void generation during the filling process is therefore effectively ruled out by the highly controllable trench oxide generation process as disclosed herein.

Figure 9A:
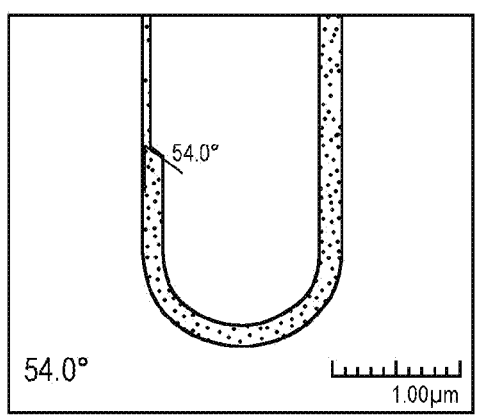
FIGS. 9A and 9B are contour-traced electron microscope images showing trench oxide flanks at different angles.
Figure 9B:
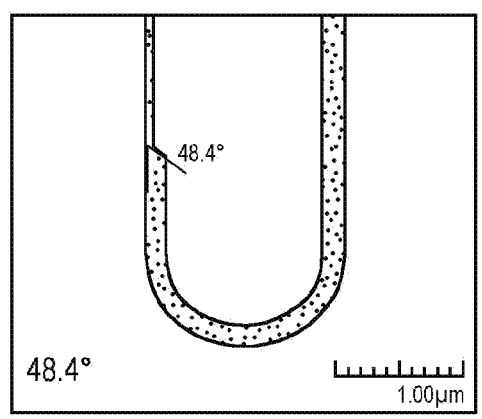

Electron microscope images of FIG. 9A and FIG. 9B illustrate the dependency of the inclination angle of the transitional section 120A_3 form the implantation dose. Referring to FIG. 9A, an inclination angle of 54.0° was obtained by using an implantation dose of $10^{14}$ cm$^{-2}$. In FIG. 9B an inclination angle of 48.4° was obtained by using a higher implantation dose. In both cases, the same implantation energy was used. FIGS. 9A and 9B are drawn to scale.

FIG. 10A is a top view of an exemplary circumferential trench 110 of a gate structure of a transistor. The trench 110 may, e.g., have a rectangular or quadratic circumferential shape. Other shapes, such as circular, etc., may also be feasible. Damaging of both sidewalls 110A, 110B of the trench 110 may, e.g., be achieved by tilted ion beam damaging as exemplified in FIGS. 2A, 2B in combination with sequential rotations of the semiconductor substrate 101 by steps of a rotation angle of 90°.

FIG. 10B is a cross-sectional view of an exemplary circumferential trench 110 of a transistor such as, e.g., the circumferential trench 110 of the transistor shown in FIG. 10A. In FIG. 10B the trench 110 is filled with the gate electrode material 140. FIG. 10B illustrates that only one of the two sidewalls (in FIG. 10B the outward sidewall—see the encircled portion) of the trench 110 is covered by the "thin" gate oxide (i.e. first section 120A_1 of the oxide layer 120 corresponding to the thin oxide layer 123 in FIG. 1I) while the bottom surface 110C of the trench 110 and the second sidewall 110B of the trench 110 are covered with trench oxide of the "thick" oxide layer 120. It is to be noted that this asymmetry in shape of the oxide layer 120 (a transitional section 120A_3 and a thin gate oxide only exist at one of the sidewalls) results in that the trench 110 provides for a smaller electrical capacitance compared with a symmetrical trench oxide design. As a consequence, the transistor (e.g. IGBT) provides for smaller switching losses.

FIG. 11 is a schematic cross-sectional view of a trench transistor 1100. The trench transistor 1100 may, e.g., be a vertical device. A drain electrode 1101 may be formed, e.g., at the backside (bottom) of the semiconductor substrate 101. A gate electrode 1102 may be formed at the front side of the semiconductor substrate 101 and is electrically connected to the gate electrode material 140. A source electrode 1103 may be formed at the front side of the semiconductor substrate in the vicinity of the trench gate oxide region.

Optionally, a region 101_1 in the semiconductor substrate 101 may be doped (e.g. by a p-dopant), while a zone 101_2 below the doped region 101_1 may serve as a n-drift zone.

While FIG. 11 schematically illustrates one possible design of a trench transistor, many other implementations are possible and the disclosure of trench transistors provided herein is not restricted to the exemplary design of FIG. 11.

FIG. 12 is a flowchart illustrating an exemplary method of manufacturing a transistor, e.g. a transistor as shown in FIG. 11.

At S1 a trench oxide in a trench for a gate structure in a semiconductor substrate is manufactured according to any one of the techniques disclosed herein.

At S2 the trench is filled with a gate electrode material.

At S3 source and drain electrodes of the transistor are produced. Further, a gate electrode may be formed to electrically connect to the gate electrode material.

The following examples pertain to further aspects of the disclosure:

Example 1 is a method of manufacturing a trench oxide in a trench for a gate structure in a semiconductor substrate, the method including generating the trench in the semiconductor substrate; generating an oxide layer over opposing sidewalls of the trench; damaging at least a portion of the oxide layer by ion implantation; coating the oxide layer with an etching mask; generating at least one opening in the etching mask adjacent to one of the opposing sidewalls; and partly removing the oxide layer by etching the oxide layer beneath the etching mask down to an etching depth at the one of the opposing sidewalls by introducing an etching agent into the opening.

In Example 2, the subject matter of Example 1 can optionally include wherein the oxide layer is damaged down to a damaging depth at only the one of the opposing sidewalls or at both of the opposing sidewalls.

In Example 3, the subject matter of Example 2 can optionally include wherein the damaging depth is less than the etching depth.

In Example 4, the subject matter of Example 2 can optionally include wherein the damaging depth is substantially equal to the etching depth.

In Example 5, the subject matter of Example 2 can optionally include wherein the damaging depth is greater than the etching depth.

In Example 6, the subject matter of any one of the preceding Examples can optionally include wherein damaging comprises ion implantation using an ion beam having an axis tilted against a vertical axis of the trench.

In Example 7, the subject matter of any one of Examples 1 to 5 can optionally include wherein damaging comprises plasma ion implantation.

In Example 8, the subject matter of any one of the preceding Examples can optionally include wherein damaging comprises damaging only a region close to the surface of the oxide layer.

In Example 9, the subject matter of any one of the preceding Examples can optionally include wherein generating the oxide layer comprises generating a mono-material layer of thermal oxide.

In Example 10, the subject matter of any one of the preceding Examples can optionally include wherein the oxide layer extends over at least one edge of the trench, and the at least one opening in the etching mask is generated in a horizontal portion of the etching mask.

Example 11 is a method of manufacturing a transistor, the method including manufacturing a trench oxide in a trench for a gate structure in a semiconductor substrate according to one of the preceding Examples; filling the trench with a gate electrode material; and producing source and drain electrodes of the transistor.

Example 12 is a semiconductor substrate, including a trench for a gate structure formed in the semiconductor substrate; an oxide layer formed over opposing sidewalls of the trench, the oxide layer comprises a first portion formed over a first sidewall and a second portion formed over a second sidewall opposite the first sidewall, wherein the first portion comprises a first section having a first thickness, a second section beneath the first section having a second thickness and a transitional section connecting the first and second sections, wherein the second thickness is greater than the first thickness and a thickness of the second portion is substantially equal to the second thickness.

In Example 13, the subject matter of Example 12 can optionally include wherein a thickness of the first portion is equal to or greater than 150 nm, 175 nm or 200 nm.

In Example 14, the subject matter of Example 12 or 13 can optionally include wherein the first thickness is equal to or less than 150 nm, 125 nm or 100 nm.

In Example 15, the subject matter of one of Examples 12-14 can optionally include wherein the transitional section has a monotonically increasing surface progression in radial trench direction.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of manufacturing a trench oxide in a trench for a gate structure in a semiconductor substrate, the method comprising:
generating the trench in the semiconductor substrate;
generating an oxide layer over opposing sidewalls of the trench;
damaging at least a portion of the oxide layer by ion implantation;
coating the oxide layer with an etching mask;
generating at least one opening in the etching mask adjacent to one of the opposing sidewalls; and
partly removing the oxide layer by etching the oxide layer beneath the etching mask down to an etching depth at the one of the opposing sidewalls by introducing an etching agent into the opening.

2. The method of claim 1, wherein the oxide layer is damaged down to a damaging depth at only the one of the opposing sidewalls or at both of the opposing sidewalls.

3. The method of claim 2, wherein the damaging depth is less than the etching depth.

4. The method of claim 2, wherein the damaging depth is substantially equal to the etching depth.

5. The method of claim 2, wherein the damaging depth is greater than the etching depth.

6. The method of claim 1, wherein damaging at least a portion of the oxide layer by ion implantation comprises ion implantation using an ion beam having an axis tilted against a vertical axis of the trench.

7. The method of claim 1, wherein damaging at least a portion of the oxide layer by ion implantation comprises plasma ion implantation.

8. The method of claim 1, wherein damaging at least a portion of the oxide layer by ion implantation comprises damaging only a region close to the surface of the oxide layer.

9. The method of claim 1, wherein generating the oxide layer comprises generating a mono-material layer of thermal oxide.

10. The method of claim 1, wherein the oxide layer extends over at least one edge of the trench, and wherein the at least one opening in the etching mask is generated in a horizontal portion of the etching mask.

11. A method of manufacturing a transistor, the method comprising:
generating a trench in a semiconductor substrate;
generating an oxide layer over opposing sidewalls of the trench;
damaging at least a portion of the oxide layer by ion implantation;
coating the oxide layer with an etching mask;
generating at least one opening in the etching mask adjacent to one of the opposing sidewalls;
partly removing the oxide layer by etching the oxide layer beneath the etching mask down to an etching depth at the one of the opposing sidewalls by introducing an etching agent into the opening, to form a trench oxide in the trench for a gate structure;
filling the trench with a gate electrode material; and
producing source and drain electrodes of the transistor.

* * * * *